United States Patent
Bujalski et al.

[11] Patent Number: 5,825,633
[45] Date of Patent: Oct. 20, 1998

[54] MULTI-BOARD ELECTRONIC ASSEMBLY INCLUDING SPACER FOR MULTIPLE ELECTRICAL INTERCONNECTIONS

[75] Inventors: C. Gregory Bujalski, Geneva; Jeffrey M. Petsinger, Wayne; Daniel T. Rooney, Schaumburg, all of Ill.

[73] Assignee: Motorola, Inc., Schaumburg, Ill.

[21] Appl. No.: 740,940

[22] Filed: Nov. 5, 1996

[51] Int. Cl.[6] ...................................................... H05K 1/11
[52] U.S. Cl. ..................... 361/804; 174/138 G; 174/267; 361/790; 361/803; 439/591; 439/82
[58] Field of Search ............................ 174/138 G, 138 E, 174/261, 267; 361/733, 735, 740, 742, 743, 744, 745, 758, 784, 785, 790, 803, 804; 439/65, 68, 74, 82, 83, 591, 631, 632; 403/16, 321; 411/450, 451, 452, 453, 455; 292/DIG. 53

[56] References Cited

U.S. PATENT DOCUMENTS

| | | | |
|---|---|---|---|
| 3,148,356 | 9/1964 | Hedden, Jr. | 361/803 |
| 4,110,904 | 9/1978 | Johnson | 174/267 |
| 5,222,014 | 6/1993 | Lin . | |
| 5,239,135 | 8/1993 | Phillips, II | 174/267 |

*Primary Examiner*—Donald Sparks
*Attorney, Agent, or Firm*—John B MacIntyre; Douglas D. Fekete

[57] ABSTRACT

A multi-board electronic assembly (10) includes a first substrate (12) and a second substrate (14) electrically connected by a spacer (16). The spacer (16) includes a first end (26) that is received in a first receptacle (18) on the first substrate (12) and a second end (28) that is received in a second receptacle (22) in the second substrate (14). The spacer (16) is formed generally of a nonconductive body (15) and includes ridges (60) and longitudinal channels (30) defined between the ridges (60). The ridges (60) are formed generally of a nonconductive material, and the spacer (16) includes a metallic strip (32) disposed within the channel (30). The metallic strip (32) forms a conductive path to connect the first circuit trace (20) to the second circuit trace (24) to form an electrically connected microelectronic assembly (10).

19 Claims, 3 Drawing Sheets

5,825,633

MULTI-BOARD ELECTRONIC ASSEMBLY INCLUDING SPACER FOR MULTIPLE ELECTRICAL INTERCONNECTIONS

FIELD OF THE INVENTION

This invention relates generally to an electronic assembly that comprises substrates, such as printed circuit boards, spaced apart by a spacer. More particularly, this invention relates to such assembly wherein the spacer comprises metallic strips within electrically isolated longitudinal channels to form electrical interconnections between circuit traces on the substrates.

BACKGROUND OF THE INVENTION

As more functionality has been added to electronic assemblies, more components and electrical interconnections have been added. This has led to substrates having a large surface area. In order to make the substrates more compact, multiple substrates have been connected to form connected substrates having interboard connections. A difficulty has been in forming electrical interconnections between the connected substrates to electrically connect traces on the substrates.

It has been proposed to use flexible strips to make the interboard connections. Flexible strips, however, have minimum bend radii and consequently consume large areas on the substrates, thereby limiting their ability to lessen the surface area of the substrates.

Another interboard connection proposed is conductive ink flexible cables. Conductive ink flexible cables have limited current carrying capacity and are difficult to attach to substrates in multi-board assemblies. Further, conductive ink flexible cables require large areas on the substrate, thereby increasing the surface area of the substrate.

Another interboard connection proposed is parallel gap welded conductors. However, gap welded conductors are expensive to fabricate, and the process of gap welding is labor-intensive.

No proposed multiple substrate assembly has proven effective in high-volume, low-cost production. Consequently, a need exists for an improved connector that both physically and electrically connects multiple substrates to form a more compact assembly.

DETAILED DESCRIPTION OF A PREFERRED EMBODIMENT

The present invention provides an electronic assembly that includes a first substrate and a second substrate in stacked, spaced arrangement. The first substrate includes a first receptacle, such as a through-hole, and a first circuit trace. The second substrate includes a second receptacle, such as a through-hole, and a second circuit trace. The assembly is joined by a spacer that includes a first end that is received in the first receptacle and a second end that is received in the second receptacle. The spacer includes longitudinal channels that comprise metallic strips to connect the first circuit trace and the second circuit trace. In this manner, the spacer not only physically joins the substrates into an assembly, but also electrically interconnects the circuit traces to permit interboard processing of electrical signals.

Figure 1:
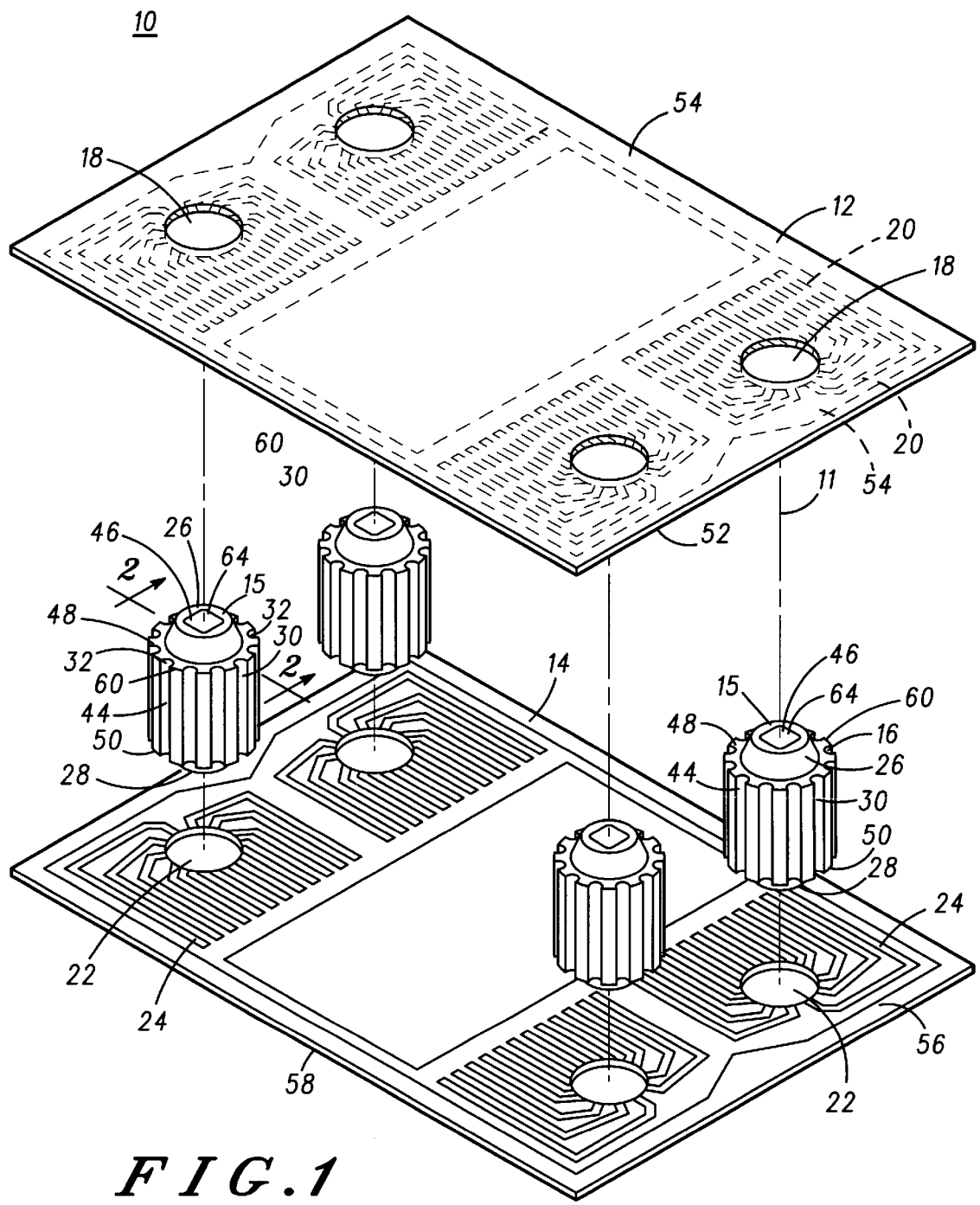
FIG. 1 is an exploded perspective view of a spacer interposed between a first substrate and a second substrate to form a multi-board electronic assembly in accordance with a preferred embodiment of the present invention.
Figure 2:
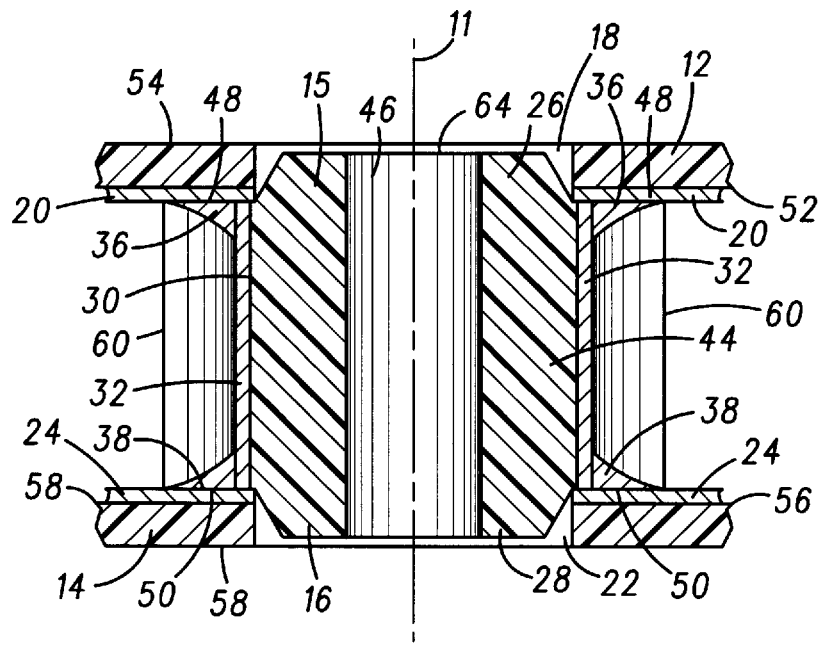
FIG. 2 is a cross-sectional view of the multi-board electronic assembly of FIG. 1 taken along line 2—2.

The present invention can be better understood with reference to FIGS. 1–4. In accordance with a preferred embodiment of this invention, FIGS. 1 and 2 depict a spacer 16 that is generally cylindrical about a longitudinal axis 11. Spacer 16 comprises a body 15 formed of a nonconductive polymeric material and having first and second ends 26 and 28, respectively, spaced apart by a midsection 44. Midsection 44 is generally cylindrical and is centered longitudinally about axis 11. First shoulder 48 extends radially between first end 26 and midsection 44, and second shoulder 50 extends radially between second end 28 and midsection 44. In a preferred embodiment, first end 26 and second end 28 are tapered to form a partially conical shape having a smaller diameter at the shoulders than midsection 44. This permits ends 26 and 28 to fit into receptacles on a first substrate and a second substrate, while midsection 44 has a greater diameter than the substrate holes to facilitate standoff between the first substrate and the second substrate, as later discussed.

Spacer 16 comprises ridges 60. In a preferred embodiment, spacer 16 is formed by extrusion or broaching to form longitudinal ridges 60. Longitudinal channels 30 are defined between ridges 60 and are plated with a conductive material, such as copper, to form a metallic strip 32. Metallic strip 32 forms an electrically conductive path that runs continuously from first shoulder 48 to second shoulder 50. Ridges 60, which are formed of a dielectric material, electrically isolate each of the metallic strips 32.

Spacer 16 defines a longitudinal cavity 46. Cavity 46 includes at least one feature indicative of rotational orientation of spacer 16. In a preferred embodiment, cavity 46 is square, and is suitable for receiving a square-ended tool for rotating spacer 16. Cavity 46 has an opening 64 at first end 26. In this manner, spacer 16 can be rotated to a predetermined orientation to orient metallic strip 32 with first circuit trace 20 and second circuit trace 24.

FIG. 1 shows an exploded perspective view of first substrate 12 and second substrate 14 with spacer 16 disposed therebetween. First substrate 12 and second substrate 14 are preferably ceramic substrates, but could alternately be a printed circuit board, a printed wiring board, a flexible substrate, or the like. First substrate 12 includes a first receptacle 18, a first inner face 52, and a first outer face 54 opposite first inner face 52. Second substrate 14 includes a second receptacle 22, a second inner face 56, and a second outer face 58 opposite second inner face 56. In a preferred embodiment, first receptacle 18 is a first through-hole and second receptacle 22 is a second through-hole. The through-holes have a diameter that is slightly greater than the diameter of first end 26 and second end 28 at first and second shoulders 48 and 50, respectively, and less than the diameter of midsection 44. In this manner, first end 26 will be received in first receptacle 18 and second end 28 will be received in second receptacle 22, while midsection 44 will be prevented from extending through receptacle 18 or receptacle 22. Consequently, first shoulder 48 abuts first substrate 12 and second shoulder 50 abuts second substrate 14 to place midsection 44 in a predetermined position between first substrate 12 and second substrate 14. This spaces substrate 12 from substrate 14.

FIG. 2 shows a cross-sectional view of assembly 10 taken along line 2—2 in FIG. 1. In a preferred embodiment, receptacles 18 and 22 are through-holes, and ends 26 and 28 extend into receptacles 18 and 22 but do not protrude from substrates 12 and 14, thereby allowing components or additional substrates to be connected to first substrate 12 at first outer face 54 or second substrate 14 at second outer face 58.

Spacer 16 is connected to first substrate 12 by first conductive connection 36 and to second substrate 14 by second conductive connection 38. In a preferred embodiment, first conductive connection 36 and second conductive connection 38 are composed of a solder alloy to form a first solder interconnection that electrically connects metallic strip 32 to first circuit trace 20 and a second solder interconnection that electrically connects metallic strip 32 to second circuit trace 24. In this example, first conductive connection 36 and second conductive connection 38 preferably are solder fillets. In an alternate embodiment, the connections are formed of a conductive epoxy body composed of conductive particles dispersed in an epoxy matrix. Conductive connections 36 and 38 are preferably formed inboard of substrates 12 and 14.

Multi-board assembly 10 is thus formed by inserting first end 26 of spacer 16 into first receptacle 18 such that first shoulder 48 abuts first inner face 52. Spacer 16 is then aligned to a predetermined orientation by orienting via cavity 46 such that metallic strips 32 align with a first conductive connection 36. Second end 28 is then inserted into second receptacle 22 such that second shoulder 50 abuts second inner face 56. First end 26 and second end 28 will self-align due to their tapered, partially conical shape. The assembly is then formed into an integral assembly by bonding spacer 16 to first substrate 12 and second substrate 14, preferably by heating to reflow solder formed where metallic strip 32 is adjacent to first conductive connection 36 and second connective connection 38 to form an integral, multi-board assembly 10.

Figure 3:
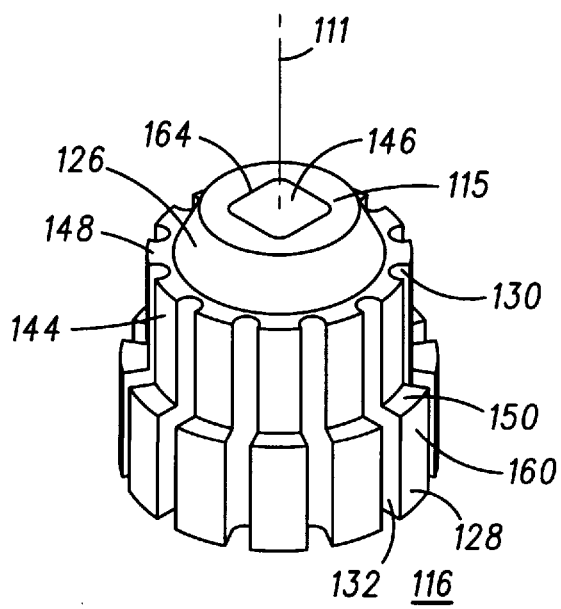
FIG. 3 is a perspective view of a spacer in accordance with an alternate embodiment of the present invention.

FIG. 3 shows a perspective view of a spacer 116 in accordance with an alternate embodiment of the present invention. Spacer 116 is formed of a nonconductive body 115 and includes a plurality of channels 130 formed between ridges 160. First shoulder 148 radially extends between first end 126 and midsection 144. Second shoulder 150 radially extends between midsection 144 and second end 128. Channels 130 are plated with a metallic plate 132 that extends from first shoulder 148 to second shoulder 150 to form a continuous conductive path. Each plate 132 is electrically isolated by dielectric ridges 160. Spacer 116 is formed of three partially conical portions that are longitudinally centered about axis 111. First end 126 has a smaller diameter at first shoulder 148 than midsection 144, which in turn has a smaller diameter at second shoulder 150 than second end 128.

Figure 4:
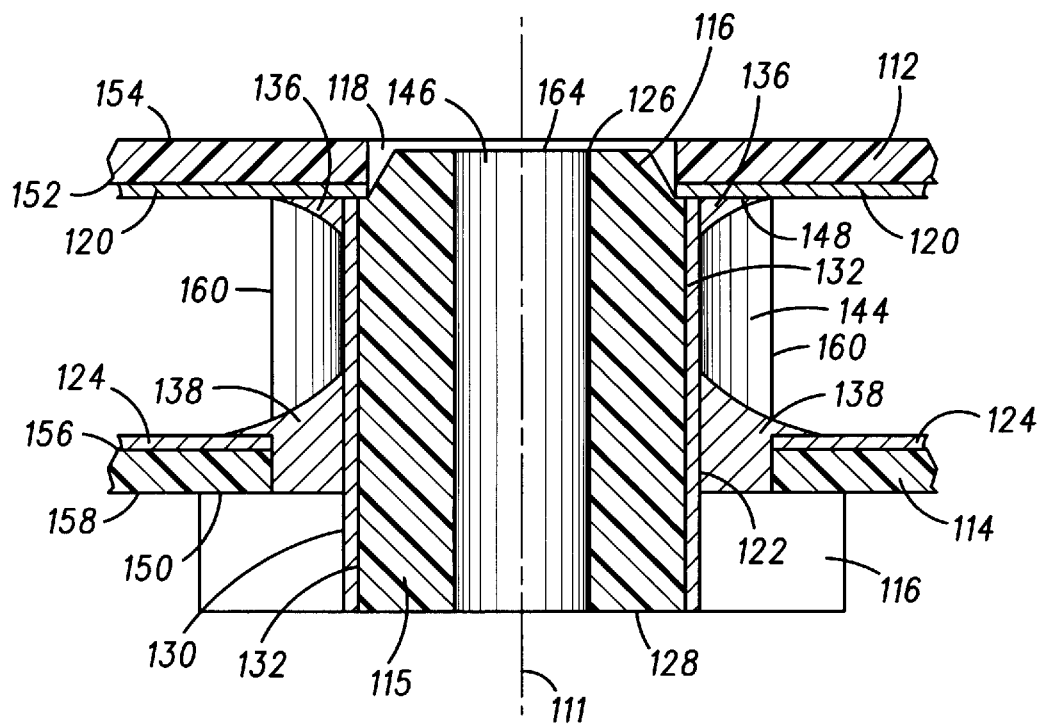
FIG. 4 is a cross-sectional view of a multi-board electronic assembly in accordance with the alternate embodiment.

FIG. 4 shows a cross-sectional view of spacer 116 connected to a first substrate 112 and a second substrate 114 to form multi-board electronic assembly 110 in accordance with the alternate embodiment. Second substrate 114 includes a second inner face 156, a second outer face 158 opposite inner face 156, and a second circuit trace 124 located on inner face 156. Spacer 116 is positioned such that first end 126 and midsection 144 are received in second through-hole 122, such that second shoulder 150 abuts second outer face 158.

Spacer 116 includes a longitudinal cavity 146 that includes an opening 164 at first end 126. Opening 164 is sized and shaped to receive a tool for orienting spacer 116 in a particular direction. Once spacer 116 has been extended through second through-hole 122, opening 164 facilitates rotation of spacer 116 such that metallic plates 132 align with second circuit traces 124.

First substrate 112 includes a first outer face 154, a first inner face 152 opposite outer face 154, and a first circuit trace 120 located on first outer face 154. First end 126 is then extended through first through-hole 118 such that first shoulder 148 abuts first inner face 152. Once spacer 116 has been oriented to a predetermined position, first conductive connection 136 and second conductive connection 138 are formed to electrically connect first circuit trace 120 and second circuit trace 124 to metallic plate 132. First conductive connection 136 and second conductive connection 138 are preferably formed of solder, but could also be formed of a conductive epoxy. Spacer 116 is electrically and mechanically connected to first substrate 112 by first conductive connection 136 and to second substrate 114 by second conductive connection 138, which are preferably formed of a solder alloy but can alternately be formed of a conductive epoxy resin. In this manner, a multi-board microelectronic assembly 110 is formed that includes multiple substrates connected in parallel, spaced relation.

Thus, the present invention provides a multi-board, compact, interconnected electronic assembly. A spacer is disposed between a first substrate and a second substrate and facilitates connection of circuit traces on the substrates. The spacer physically joins the substrates into an integral assembly and connects circuits on the two substrates for conducting electrical signals between the two substrates.

Although the present invention has been described with a generally cylindrical spacer, the spacer may be formed in any shape that mates with receptacles in a first substrate and a second substrate. Further, the receptacles do not need to go through the substrates, but can be a closed receptacle that receives the ends of the spacer. In this manner, surface area available on the outboard surface of the substrate is not diminished by the receptacle, but can be utilized for mounting components or routing traces. Additionally, the through-holes in the substrates can be formed in areas of the substrates such that integrated circuit components overlie the through-hole. The connections to the integrated circuit component are formed about the through-hole such that utilization of the substrate is increased.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A multi-board electronic assembly comprising:
   a first substrate that includes a first receptacle and a first circuit trace;
   a second substrate that includes a second receptacle and a second circuit trace; and
   a spacer having a longitudinal axis, a first end received in the first receptacle, a second end received in the second receptacle, a midsection having at least a ridge and a longitudinal channel, said spacer being formed generally of a nonconductive body and including a metallic strip generally recessed relative to the ridge and disposed within the channel to form a conductive path to connect the first circuit trace and the second circuit trace.

2. A multi-board electronic assembly in accordance with claim 1, further comprising:

a first solder interconnection electrically connecting the metallic strip to the first circuit trace; and a second solder interconnection electrically connecting the metallic strip to the second circuit trace.

3. A multi-board electronic assembly in accordance with claim 1, further comprising:

a first conductive epoxy body electrically connecting the metallic strip to the first circuit trace; and a second conductive epoxy body electrically connecting the metallic strip to the second circuit trace.

4. A multi-board electronic assembly in accordance with claim 1, wherein a first shoulder is formed between the first end and the midsection and a second shoulder is formed between the second end and the midsection, and wherein the conductive path is continuous between the first shoulder and the second shoulder.

5. A multi-board electronic assembly in accordance with claim 1, wherein the first end and the second end are partially conical.

6. The multi-board electronic assembly according to claim 1 wherein the metallic strip has a concave cross section relative to the ridge.

7. The multi-board electronic assembly according to claim 1 wherein the spacer further comprises a cavity in the first end adapted to receive an aligning tool for rotating the spacer relative to the first substrate.

8. A multi-board electronic assembly comprising:

a first substrate that includes a first through-hole and a first circuit trace;

a second substrate that includes a second through-hole and a second circuit trace;

a spacer formed of a nonconductive body and comprising a longitudinal axis, a generally cylindrical midsection centered longitudinally about the axis, a first end that is received in the first through-hole, a second end that is received in the second through-hole, a plurality of longitudinal ridges, and at least two channels defined between the ridges, each of the channels including a metallic strip generally recessed relative to the ridges and being electrically isolated from each of the other channels by the longitudinal ridges;

a first electrically conductive connection connecting the metallic strip and the first circuit trace; and a second electrically conductive connection connecting the metallic strip and the second circuit trace.

9. A multi-board electronic assembly in accordance with claim 8, wherein the first electrically conductive connection comprises a first solder fillet, and wherein the second electrically conductive connection comprises a second solder fillet.

10. A multi-board electronic assembly in accordance with claim 8, the spacer further comprising a first shoulder radially extending between the midsection and the first end and abutting the first substrate.

11. A multi-board electronic assembly in accordance with claim 8, the spacer further comprising a second shoulder radially extending between the midsection and the second end and abutting the second substrate.

12. A multi-board electronic assembly in accordance with claim 8, wherein the spacer defines a longitudinal cavity that includes at least one feature indicative of rotational orientation of the spacer.

13. A multi-board electronic assembly comprising:

a first substrate that includes a first through-hole, a first circuit trace, a first inner face, and a first outer face opposite the first inner face;

a second substrate that includes a second through-hole, a second circuit trace, a second inner face facing the first face, and a second outer face opposite the second inner face;

a generally cylindrical spacer formed generally of a nonconductive body and comprising a longitudinal axis, a midsection centered longitudinally about the axis, a partially conical first end that is received in the first through-hole, a partially conical second end that is received in the second through-hole, a plurality of longitudinal ridges, a plurality of channels defined between the longitudinal ridges that include a plurality of metallic strips to form a plurality of conductive paths, and means for rotational orienting the spacer in a predetermined orientation;

a first electrically conductive connection connecting the metallic strip and the first circuit trace; and a second electrically conductive connection connecting the metallic strip and the second circuit trace.

14. A multi-board electronic assembly in accordance with claim 13, wherein the first electrically conductive connection and the second electrically conductive connection are composed of a solder alloy.

15. A multi-board electronic assembly in accordance with claim 13, wherein the first electrically conductive connection and the second electrically conductive connection are composed of solder fillets.

16. A multi-board electronic assembly in accordance with claim 13, wherein the first electrically conductive connection and the second electrically conductive connection are composed of conductive particles dispersed in an epoxy matrix.

17. A multi-board electronic assembly in accordance with claim 13, wherein the cavity has an opening at the first end, the opening having means for rotational orienting the spacer.

18. A multi-board electronic assembly in accordance with claim 13, wherein the opening is effective to receive a tool for rotating the spacer.

19. A multi-board electronic assembly in accordance with claim 13, further comprising at least one feature for facilitating rotational orientation.

* * * * *